(12) United States Patent
Reddy et al.

(10) Patent No.: US 12,400,946 B2
(45) Date of Patent: Aug. 26, 2025

(54) CIRCUIT BOARD ASSEMBLY HAVING CIRCUIT BOARD WITH ADJACENT CHIPS IMMERSED IN DIELECTRIC LIQUID AND METHOD OF MAKING THE SAME

(71) Applicant: Auradine, Inc., Santa Clara, CA (US)

(72) Inventors: Anuya Reddy, Pleasanton, CA (US); Lyle Looney, Livermore, CA (US); Darshan Shah, Milpitas, CA (US)

(73) Assignee: Auradine, Inc., Santa Clara, CA (US)

( * ) Notice: Subject to any disclaimer, the term of this patent is extended or adjusted under 35 U.S.C. 154(b) by 0 days.

(21) Appl. No.: 18/661,056

(22) Filed: May 10, 2024

(65) Prior Publication Data

US 2025/0125246 A1 Apr. 17, 2025

Related U.S. Application Data

(63) Continuation of application No. 18/486,637, filed on Oct. 13, 2023, now Pat. No. 11,984,391.

(51) Int. Cl.
| | |
|---|---|
| *H01L 23/498* | (2006.01) |
| *H01L 23/367* | (2006.01) |
| *H05K 3/00* | (2006.01) |
| *H05K 3/30* | (2006.01) |

(52) U.S. Cl.
CPC .... *H01L 23/49838* (2013.01); *H01L 23/3675* (2013.01); *H05K 3/0085* (2013.01); *H05K 3/303* (2013.01)

(58) Field of Classification Search
CPC ......... H01L 23/49838; H01L 23/3675; H05K 3/303

See application file for complete search history.

(56) References Cited

U.S. PATENT DOCUMENTS

| | | | |
|---|---|---|---|
| 3,812,402 A | 5/1974 | Garth | |
| 2003/0089978 A1 | 5/2003 | Miyamoto et al. | |
| 2014/0363124 A1* | 12/2014 | Pelley | G02B 6/3562 385/16 |
| 2016/0081197 A1 | 3/2016 | Arvelo et al. | |
| 2019/0319626 A1 | 10/2019 | Dabral et al. | |
| 2020/0328139 A1 | 10/2020 | Chiu et al. | |
| 2021/0151408 A1* | 5/2021 | Yu | H01L 24/19 |
| 2022/0361315 A1 | 11/2022 | Zhou et al. | |
| 2023/0071418 A1 | 3/2023 | Hung et al. | |
| 2023/0420410 A1* | 12/2023 | Suthram | H01L 24/09 |

* cited by examiner

*Primary Examiner* — Michael Jung
(74) *Attorney, Agent, or Firm* — Fish & Richardson P.C.

(57) ABSTRACT

A circuit board assembly is provided. The circuit board assembly includes a circuit board and a plurality of chips assembled on a surface of the circuit board. The plurality of chips include integrated circuit (IC) chips. At least two chips are positioned on the surface of the circuit board adjacent to one another with a spacing separating the two chips that is less than a minimum dimension of each of the two chips. A circuit board and a method for circuit board assembly are also provided.

20 Claims, 5 Drawing Sheets

CIRCUIT BOARD ASSEMBLY HAVING CIRCUIT BOARD WITH ADJACENT CHIPS IMMERSED IN DIELECTRIC LIQUID AND METHOD OF MAKING THE SAME

CROSS-REFERENCE TO RELATED APPLICATION

This application is a continuation of application of U.S. patent application Ser. No. 18/486,637, filed on Oct. 13, 2023, the disclosure of which is incorporated by reference.

TECHNICAL FIELD

This disclosure relates generally to circuit boards, and in particular, to circuit board assemblies for large-scale computing.

BACKGROUND

Large-scale computing usually involves many electronic circuits to generate a large amount of computing power. For example, in cryptocurrency mining, a computing system often has tens or hundreds of application specific integrated circuits (ASICs) that work collaboratively to resolve complex tasks. These ASICs can consume a considerable amount of energy when operating.

SUMMARY

The present disclosure describes a circuit board assembly with improved chip density and reduced voltage drop between chips. Implementations of the present disclosure can advantageously improve computing efficiency of large-scale computing, e.g., to perform cryptographic operations for blockchain hash computations.

In a general aspect, a circuit board assembly is provided. The circuit board assembly includes a circuit board and a plurality of chips assembled on a surface of the circuit board. The plurality of chips includes integrated circuit (IC) chips. At least two chips are positioned on the surface of the circuit board adjacent to one another with a spacing separating the two chips that is less than a minimum dimension of each of the two chips.

Particular implementations may include one or more of the following features. In some implementations, the circuit board assembly further includes a dielectric liquid in which the circuit board is immersed. In some implementations, the dielectric liquid is thermo-conductive.

In some implementations, the circuit board assembly further includes a boilerplate that is coupled to the plurality of chips. The boilerplate is configured to dissipate heat generated by the plurality of chips.

In some implementations, the two chips are spaced apart adjacent to one another without an intervening metallic spacer.

In some implementations, the plurality of chips is arranged in a plurality of columns, with each column of the plurality of columns including a subset of the plurality of chips. The subset of chips in each column are placed adjacent to one another without intervening metallic spacers.

In some implementations, the plurality of columns are grouped into a plurality of arms, with each arm including a subset of columns of the plurality of columns. The respective subset of columns in each arm are electrically coupled to one another using one or more connector terminals to the subset of columns. The subset of columns in one arm is electrically uncoupled from the subset of columns in an adjacent arm in at least one terminal end of the adjacent arms.

In some implementations, the circuit board assembly further includes a plurality of ports disposed on the circuit board and electrically coupled to the plurality of chips.

In some implementations, the minimum distance is determined based on a physical limitation of a chip assembly machine.

In some implementations, the minimum distance is equal to or less than 0.5 millimeter.

In a general aspect, a method is provided. The method includes assembling a plurality of chips on a surface of a circuit board, including arranging the chips in a plurality of columns on the surface of the circuit board. Each column of the plurality of columns includes a subset of the plurality of chips. The arranging includes: for each column, positioning the subset of chips in the column such that at least two adjacent chips in the subset are positioned with a spacing separating the two chips that is less than a minimum dimension of each of the two adjacent chips; and electrically coupling the plurality of columns to a plurality of ports on the circuit board.

In some implementations, the method includes operations for implementing one or more features of the circuit board assembly as described above.

Using the novel features described above and in the following sections of this specification, the ASIC chip density of printed circuit boards (PCBs) used in large-scale computing systems can be increased without an increase in the size of the PCBs, the energy consumed by the PCBs, or the heat generated during computation. The removal of metallic spacers between adjacent chips (e.g., ASICs) enables packing more chips on a PCB. By having more chips on a PCB, more computations (e.g., cryptographic hash operations) can be performed. Positioning the chips closer to one another using the disclosed techniques leads to a reduction in the voltage drop between chips; this can allow powering the chips with lower voltage compared to the traditional case in which metallic spacers are placed between adjacent chips. Accordingly, using the disclosed techniques, the computing performance, such as hash rate and energy efficiency, can be improved.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers in the figures indicate like elements.

DETAILED DESCRIPTION

Figure 1A:
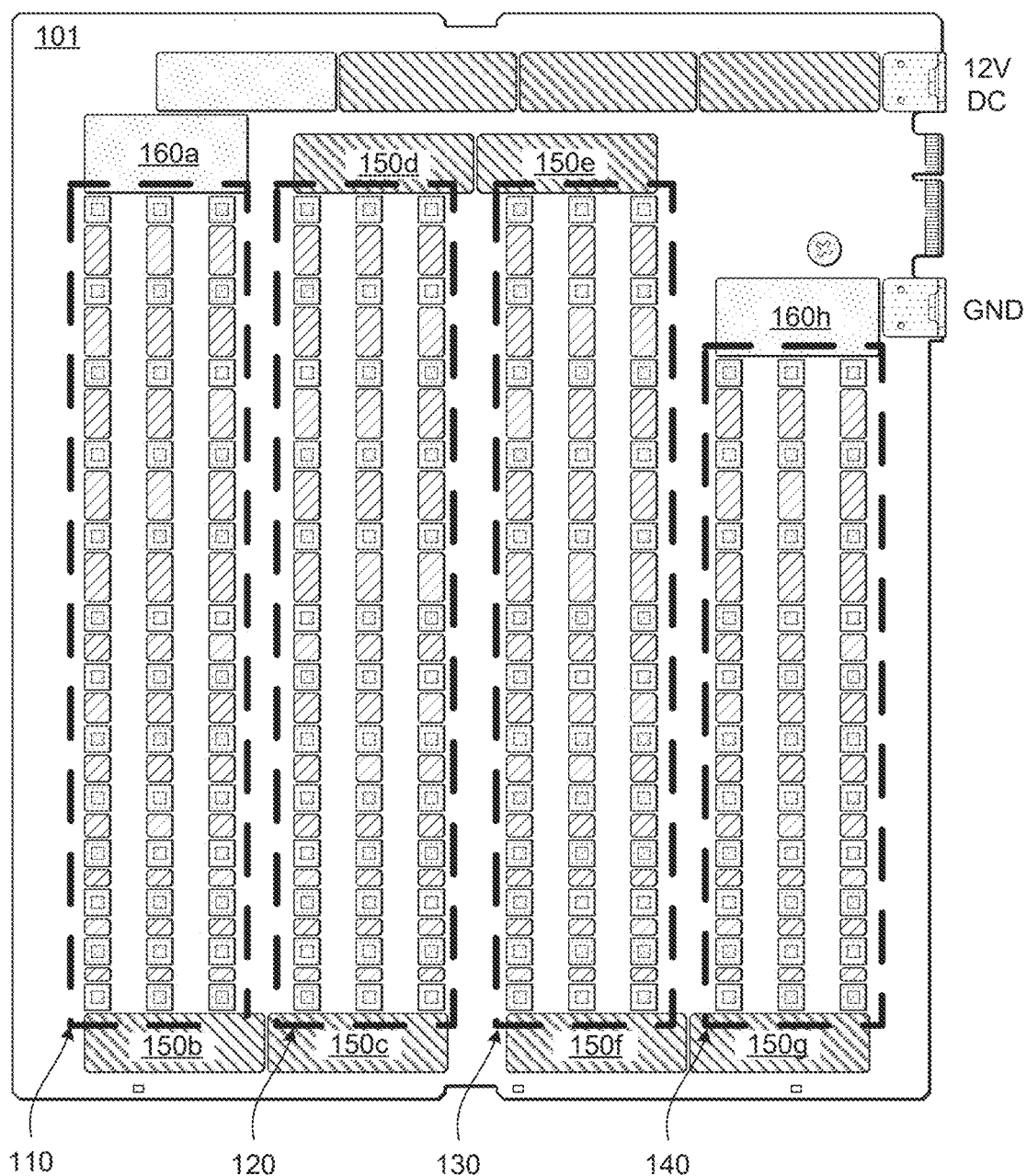
FIG. 1A illustrates a circuit board assembly for large-scale computing.

A large number of chips, such as ASICs, can be assembled on a circuit board, such as a printed circuit board (PCB), to perform a large-scale computing task, e.g., parallel cryptographic hash computations such as for blockchain operations, among others. The circuit board can have one or more ports to provide voltage supply and ground to the chips. The circuit board can also have one or more ports for the chips to receive data for performing the computation(s) and output data resulting from the computation(s). For tasks such as mining cryptocurrency (cryptomining), the computation performance is largely affected by the available computation power, which correlates to the number of chips performing the computation. Accordingly, it is desirable to increase the number of chips on the same circuit board. In this context, cryptocurrency is a digital currency that uses encryption to secure transactions and blockchain technology to verify transactions based on cryptographic hash computations. Examples of cryptocurrencies include Bitcoin, Ethereum, and Tether.

Chips can generate heat when in operation. When a circuit board has a high density of chips, the chips may need to be cooled during operation to properly function. Some existing systems use forced air to reduce the ambient temperature of the chips. To improve cooling effectiveness, the chips, especially those located at a distance from the source of forced air, are often spaced apart from each other for heat dissipation, which results in a decrease in the chip density on a circuit board. Moreover, to reduce the voltage drop from the spacings, these systems often use metallic spacers, such as copper bars, that are disposed in the spacings between adjacent chips and connected to the metallic layers of the circuit board. These metallic spacers occupy valuable space on the PCB. Additionally, due to manufacturing limitations, the metallic spacers may not be able to completely fill in the gaps between the metallic spacers and the chips. These gaps may cause unwanted voltage drop.

The techniques described in this disclosure realize system configurations that use fewer or no metallic spacers to separate adjacent chips on a circuit board. As described below, the disclosed implementations enable chips to be assembled very close to each other, e.g., without intervening metallic spacers and/or with a distance between two adjacent chips that is much smaller than the dimensions of the chips. The chips can be cooled without the need for large spacings. e.g., using fluid immersion. Because metallic spacers are not used, more space becomes available on the PCB, and more chips can be assembled using the additional available space. As such, the chip density on a circuit board can be increased, enabling more operations per circuit board. For example, more cryptographic hash computations can be per PCB performed using a greater number of chips, which can advantageously lead to an increase in the hash rate of computing. The implementations also lead to a reduction in voltage drop between adjacent chips compared to systems in which metallic spacers are used, which can increase energy efficiency of the computing.

It is to be noted that although process steps, method steps, algorithms or the like may be described in a sequential order above, such processes, methods and algorithms may generally be configured to work in alternate orders, unless specifically stated to the contrary.

FIG. 1A illustrates a circuit board assembly 100, which can be used for large-scale computing tasks, such as cryptomining.

As shown in FIG. 1A, circuit board 100 includes a circuit board 101, which can be a PCB with one or more layers. Circuit board 100 also includes a plurality of chips 102 assembled, e.g., via soldering, on a surface of circuit board 101. Chips 102 can collaboratively or individually perform the computing tasks. A metallic spacer 103, such as a copper bar, is arranged between two adjacent chips 102 to expedite heat dissipation from chips 102 and to reduce voltage drop caused by the spacings.

Circuit board 100 with the metallic spacers 103 represents a conventional circuit board used for computing tasks. Heat generated during the operation of chips on circuit board assembly 100 can be cooled with forced air. In the scenario illustrated, a fan can blow air in a direction from the bottom of FIG. 1 to the top of FIG. 1. Because chips closer to the fan are likely to be cooled more effectively than chips farther from the fan, the spacings between adjacent chips 102 (which correlate to dimensions of the metallic spacers 103) increase from the bottom of FIG. 1 to the top of FIG. 1. As shown in FIG. 1, many of metallic spacers 103 have dimensions comparable or even greater than dimensions of chips 102. Having these metallic spacers 103 thus require considerable amount of surface area of circuit board 101.

Circuit board assembly 100 also includes a 12 V direct current (DC) voltage supply, a ground voltage GND, one or more metallic connectors 150b-150g (collectively, metallic connectors 150), and one or more ports 160a, 160h (collectively, ports 160), which, together with chips 102, form an electric loop. These components can be arranged in a variety patterns, depending on factors such as the function of each chip 102 in a task, the computational power of each chip 102, and the geometries of chips 102 and/or circuit board 101. For example, in assembly 100, chips 102 are arranged to form four arms 110-140, with each arm having three columns of chips 102. Columns within an arm can independently or jointly perform one or more computing tasks. In some implementations, some columns within an arm are electrically connected (e.g., using one or more connector terminals) to allow data of the one or more computing tasks to be shared between these columns. In some implementations, columns within one arm are electrically uncoupled from columns within another arm (e.g., an adjacent arm). For example, at a terminal of arm 140, columns within arm 140 are electrically uncoupled from columns within adjacent arm 130.

Each two adjacent arms are connected by a connector 150, which can be one of 150b-150g. In addition, an end of arm 110 and an end of arm 140 are respectively connected to ports 160a and 160h. Accordingly, data for the computing task can flow following a path from port 160a through arm 110 to connector 150b, then from connector 150c through arm 120 to connector 150d, then from connector 150e through arm 130 to connector 150f, and then from connector 150g through arm 140 to connector 160h.

Figure 1B:
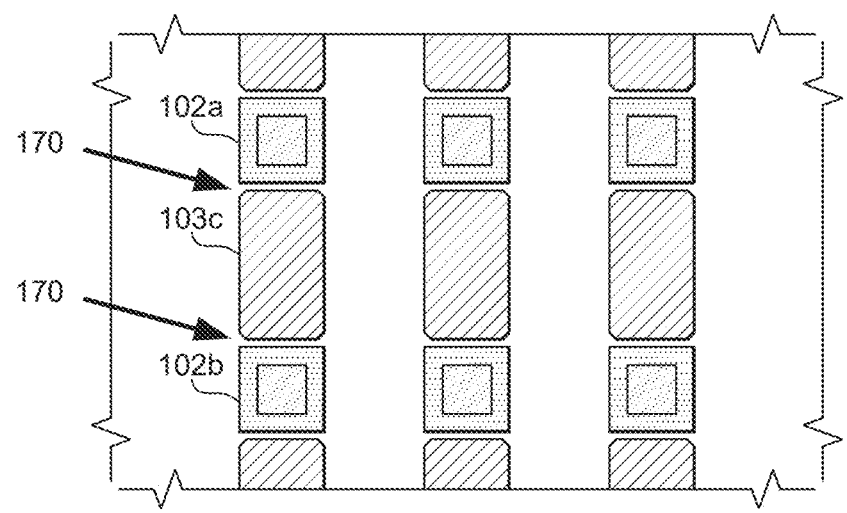
FIG. 1B provides an enlarged partial view of spacings between adjacent chips in the circuit board assembly of FIG. 1A.

FIG. 1B provides an enlarged partial view of spacings between adjacent chips 102 in circuit board assembly 100 of FIG. 1A. As illustrated in FIG. 1B, adjacent chips 102a and 102b are spaced apart by metallic spacer 103c. Between metallic spacer 103c and each of chips 102a and 102b, there is a gap 170—these gaps are present due to physical limitations when circuit board 100 is manufactured. While the size of a single gap 170 is relatively small compared to the dimension of circuit board assembly 100, the circuit board typically has a large number of gaps 170, correlating as two gaps 170 for every metallic spacer 103. All the metallic spacers 103 along with corresponding gaps 170 together consume considerable area on the circuit board surface; and the gaps 170 together can cause considerable voltage drop due to non-conductivity. Some implementations disclosed herein, such as those described below with reference to FIGS. 2A-3, remove some or all metallic spacers 103c from assembly 100 and in doing so also reduce the total area occupied by gaps 170.

Figure 2A:
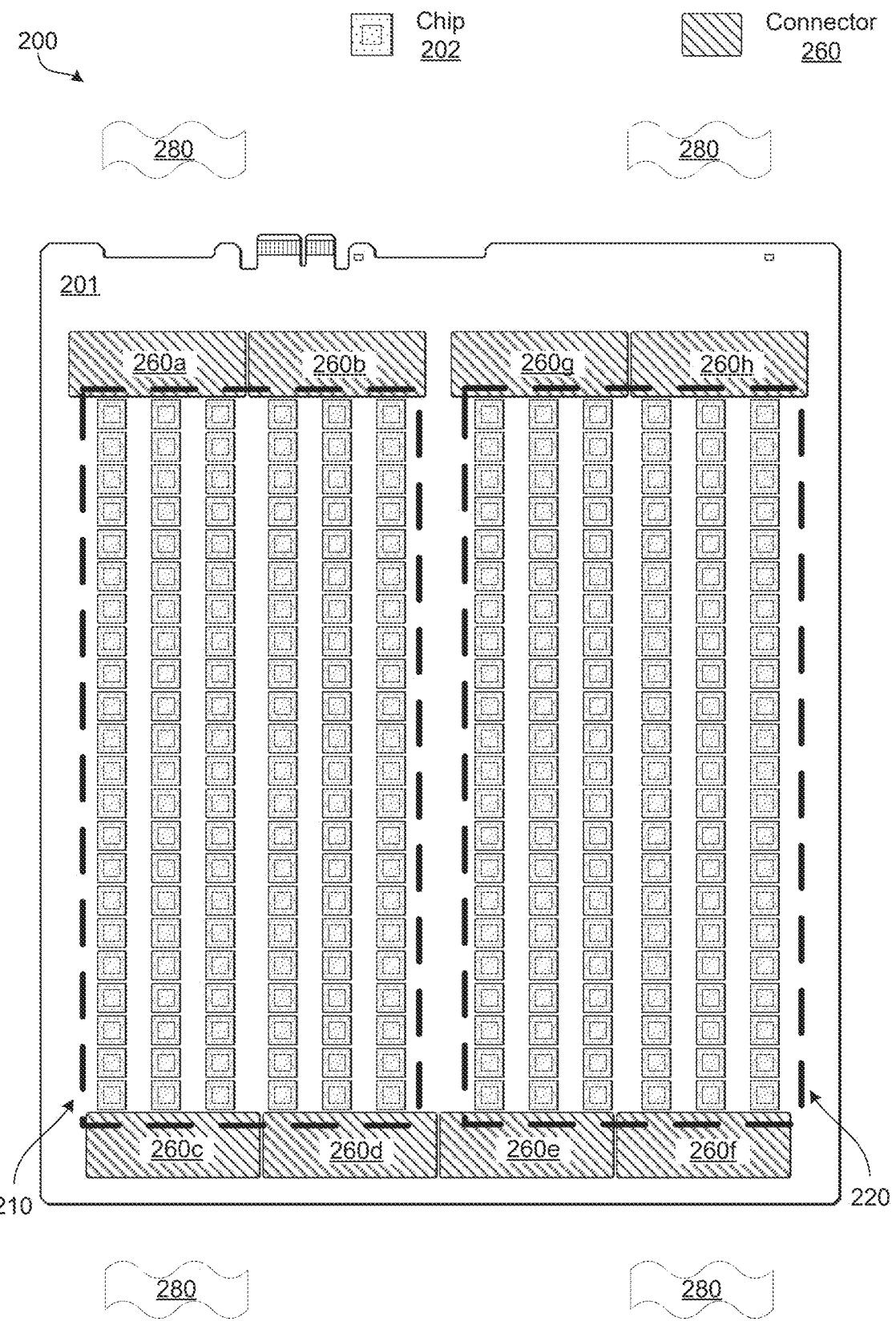
FIG. 2A illustrates a circuit board assembly for large-scale computing, according to some implementations.

FIG. 2A illustrates a circuit board assembly 200 for large-scale computing, according to some implementations. Circuit board assembly 200 has a circuit board 201 with a plurality of chips 202 assembled thereon. Each chip 202 is an ASIC configured to perform cryptographic operations, e.g., hash computations for blockchain. The circuit board assembly 200 can be used for large-scale computing tasks such as blockchain operations, e.g., for cryptocurrency mining noted previously.

Chips 202 can be arranged in a variety of patterns. For example, in FIG. 2A, chips 202 form arms 210 and 220, with each arm having six columns of chips 202. When chips 202 performs a computing task, data for the computing task can flow following a path from connectors 260a and 260b through arm 210 to connectors 260c and 260d, respectively, and then flow following a path from connectors 260e and 260f through arm 220 to connectors 260g and 260h, respectively. It is noted that the illustrated pattern of arrangement is only an example and should not limit the scope of this disclosure. Other arrangements are possible in different implementations. For example, chips 202 can be arranged in a different number of arms other than arms 210 and 220. Additionally or alternatively, each arm can have a different number of columns of chips 202. In addition to the illustrated components, circuit board 201 can have one or more voltage supplies and ports (e.g., components similar to the voltage supplies and ports described with respect to circuit board assembly 100), which are omitted from illustration for brevity.

Figure 2B:
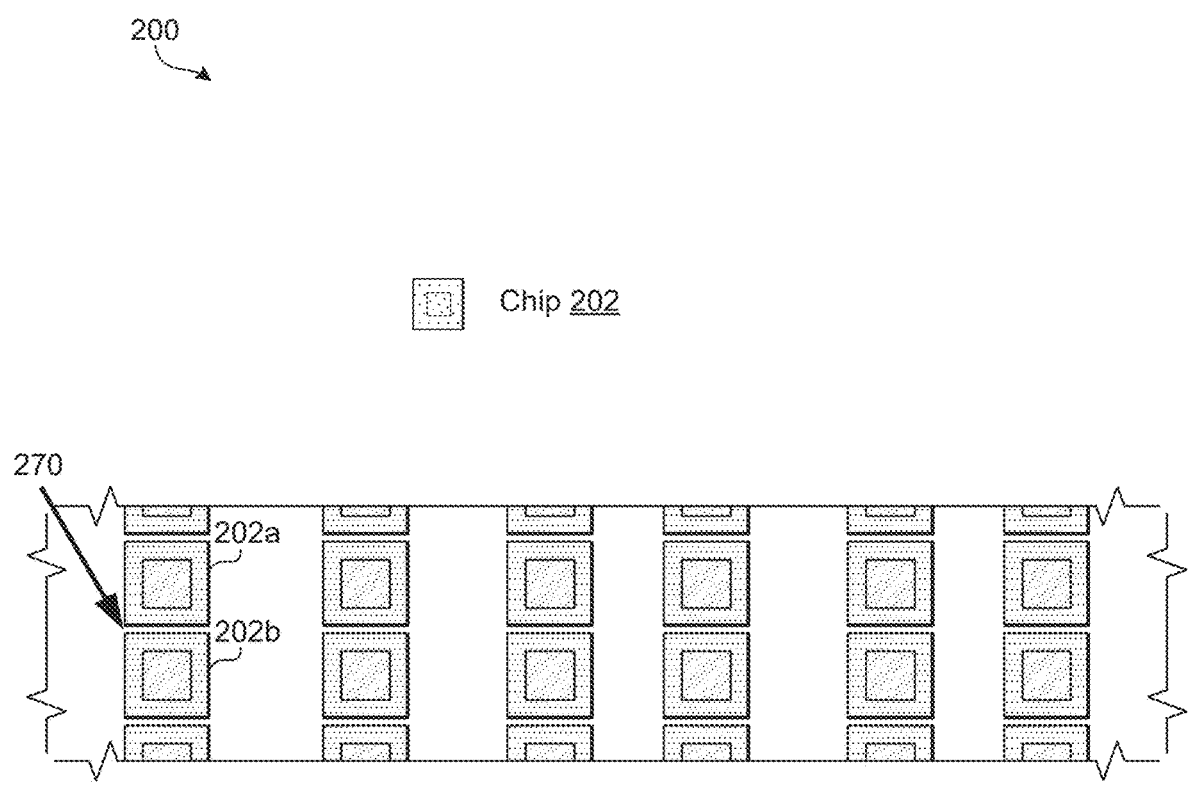
FIG. 2B provides an enlarged partial view of spacings between adjacent chips in the circuit board assembly of FIG. 2A.

As shown by FIG. 2B, in circuit board assembly 200, adjacent chips 202 are not spaced apart by metallic spacers, in contrast to the use of metallic spacer 103 in assembly 100. Accordingly, assembly 200 can have higher chip density than assembly 100. For example, when the surface areas of circuit boards 101 and 201 are the same, assembly 100 is shown to have 150 chips 102, while assembly 200 is shown to have 264 chips 202. The increase in chip density can advantageously increase the throughput of computing tasks performed using the circuit board assembly 200, e.g., increase the number of cryptographic operations (e.g., blockchain hash computations) performed by the circuit board assembly 200 per unit of time, using the greater number of chips 202 that are packaged together.

FIG. 2B provides an enlarged partial view of spacings between adjacent chips in circuit board assembly 200 of FIG. 2A. As shown in FIG. 2B, because there is no metallic spacer between chips 202a and 202b, only one gap 270 (which can be non-conductive) spaces the two chips apart. With the size of a single gap being the same, assembly 200 can significantly reduce (e.g., halve) the total area occupied by gaps compared to assembly 100. Compared with assembly 100, assembly 200 not only increases chip density but also reduces the voltage drop due to fewer non-conductive gaps between chips 201, which in turn can increase power efficiency.

Typically, gap 270 can be made very small, e.g., smaller than the minimum dimension of adjacent chips 202. In some implementations of assembly 200, the minimum spacing (e.g., the smallest gap) between any of two adjacent chips 202 is approximately 0.5 millimeter (mm), whereas the dimension of each chip along the surface of a circuit board is in the order of 1 to 10 mm. By contrast, chips of similar dimensions in assembly 100 can require spacings (e.g., space occupied by gaps 170 and metallic spacer 103c) as large as 80 mm to be effectively cooled.

In some implementations, the minimum spacing is determined based on a physical limitation of a chip assembly machine. For example, the minimum spacing can be set to 0.5 mm, with a tolerance machine-specific, e.g., determined using a pick-and-process assembly process in accordance with an Institute of Printed Circuits (IPC) standard. In an example scenario, while it may be desirable to reduce the minimum spacing, the minimum spacing is made large enough to accommodate a mechanic hand of the chip assembly machine that solders each chip 202 on circuit board 201 during assembly. In another example scenario, the minimum spacing is made large enough to accommodate tools that remove and replace a faulty chip.

In some implementations, to prevent chips 202 in assembly 200 from overheating, the circuit board 201 is immersed in dielectric liquid 280. The dielectric liquid, which can be static or flowing, can be thermo-conductive such that heat generated by each of chips 202 is dissipated. Alternatively or additionally, assembly 200 can include a boilerplate, which can be made of thermo-conductive material such as copper, that covers chips 202. The boilerplate can serve as a heatsink that reduces the temperature of chips 202. As such, even without use of metallic spacers and large gaps between chips 202, assembly 200 can be effectively cooled. For example, the rate of cooling for circuit board assembly 200 can be similar to the rate of cooling for the conventional circuit board assembly 100.

Figure 3:
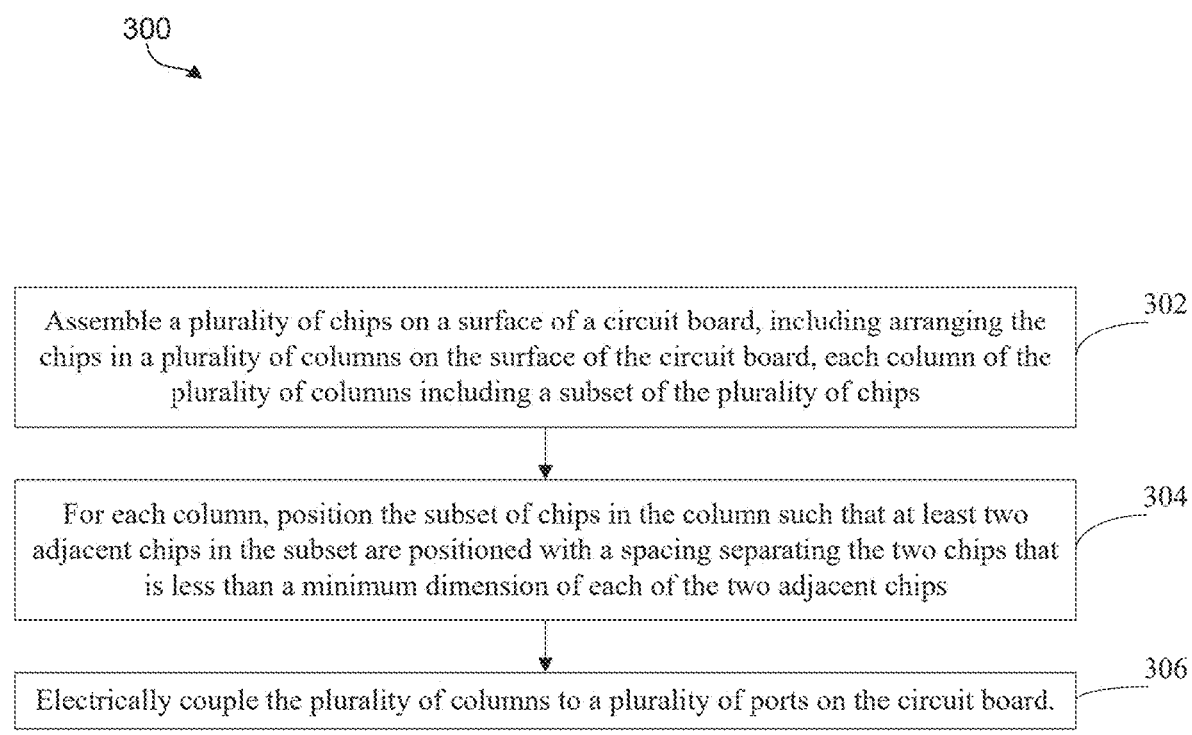
FIG. 3 is a flowchart showing an example method, according to one or more implementations.

FIG. 3 is a flowchart showing an example method 300, according to one or more implementations. Method 300 can be practically carried out in laboratory or manufacturing facilities or simulatively performed on a computer-aid design (CAD) software platform.

At 302, method 300 includes assembling a plurality of chips on a surface of a circuit board, including arranging the chips in a plurality of columns on the surface of the circuit board, each column of the plurality of columns comprising a subset of the plurality of chips. The assembling of the chips can be similar to assembly 200 of FIGS. 2A and 2B.

At 304, as part of the arranging of the chips, method 300 includes, for each column, positioning the subset of chips in the column such that at least two adjacent chips in the subset are positioned with a spacing separating the two chips that is less than a minimum dimension of each of the two adjacent chips.

At 306, as part of the arranging of the chips, method 300 includes electrically coupling the plurality of columns to a plurality of ports on the circuit board.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A circuit board assembly comprising:
a circuit board configured to be immersed in a dielectric liquid, the circuit board comprising:
a plurality of integrated circuit (IC) chips assembled on a surface of the circuit board and arranged in a plurality of columns that are grouped into a plurality of arms, each arm comprising a subset of columns of the plurality of columns,
wherein the subset of columns in each arm are electrically coupled to one another using one or more connector terminals,
wherein the one or more connector terminals are at opposite ends of each of the plurality of arms,
wherein each column of the plurality of columns comprises a subset of the plurality of IC chips, and
wherein the IC chips in each subset are directly placed adjacent to one another without intervening metallic spacers.

2. The circuit board assembly of claim 1, further comprising the dielectric liquid, wherein the dielectric liquid is thermo-conductive.

3. The circuit board assembly of claim 1, further comprising a boilerplate that is coupled to the circuit board, the boilerplate configured to dissipate heat generated by the plurality of IC chips.

4. The circuit board assembly of claim 1, wherein two adjacent IC chips in each column are separated by a spacing having a width that is configured to accommodate at least one of:
a chip removal tool in the spacing, or
a mechanic hand of a chip soldering machine,
wherein a dimension of each IC chip of the plurality of IC chips along a surface of the circuit board is greater than or equal to 1 millimeter (mm) and less than or equal to 10 mm, and
wherein two adjacent IC chips in each arm are separated by a spacing having a width that is less than or equal to 0.5 mm.

5. The circuit board assembly of claim 4, wherein the width is equal to or less than 0.5 millimeter.

6. The circuit board assembly of claim 1, wherein the subset of columns in at least one arm of the plurality of arms is electrically uncoupled from the subsets of columns in one or more adjacent arms of the plurality of arms.

7. The circuit board assembly of claim 1, wherein the circuit board further comprises a port, and wherein the plurality of arms comprise an arm having an end that is electrically coupled to the port.

8. The circuit board assembly of claim 1, wherein the plurality of IC chips are configured to perform cryptographic hash computations corresponding to cryptocurrency mining.

9. The circuit board assembly of claim 8, wherein IC chips in the subset of columns in each arm are configured to share data of the cryptographic hash computations.

10. A circuit board comprising:
a plurality of integrated circuit (IC) chips assembled on a surface of the circuit board and arranged in a plurality of columns that are grouped into a plurality of arms, each arm comprising a subset of columns of the plurality of columns,
wherein the subset of columns in each arm are electrically coupled to one another using one or more connector terminals,
wherein the one or more connector terminals are at opposite ends of each of the plurality of arms,
wherein each column of the plurality of columns comprises a subset of the plurality of IC chips, and
wherein the IC chips in each subset are placed directly adjacent to one another without intervening metallic spacers.

11. The circuit board of claim 10, wherein the plurality of IC chips are covered by a boilerplate that is configured to dissipate heat generated by the plurality of IC chips.

12. The circuit board of claim 10, wherein two adjacent IC chips in each arm are separated by a spacing having a width that is configured to accommodate at least one of:
a chip removal tool in the spacing, or
a mechanic hand of a chip soldering machine.

13. The circuit board of claim 12, wherein the width is equal to or less than 0.5 millimeter.

14. The circuit board of claim 10, wherein the plurality of columns are grouped into a plurality of arms, each arm comprising a subset of columns of the plurality of columns, wherein the subset of columns are electrically coupled to one another using one or more connector terminals.

15. The circuit board of claim 10, wherein the subset of columns in each arm are electrically uncoupled from the subsets of columns in the other arms.

16. The circuit board of claim 10, wherein the circuit board further comprises a port, and wherein the plurality of arms comprise an arm having an end that is electrically coupled to the port.

17. The circuit board of claim 10, wherein the plurality of IC chips are configured to perform cryptographic hash computations corresponding to cryptocurrency mining.

18. The circuit board of claim 17, wherein IC chips in the subset of columns in each arm are configured to share data of the cryptographic hash computations.

19. A method, comprising:
arranging a plurality of integrated circuit (IC) chips in a plurality of columns on a surface of a circuit board; and
grouping the plurality of columns into a plurality of arms, each arm comprising a subset of columns of the plurality of columns,
wherein the subset of columns in each arm are electrically coupled to one another using one or more connector terminals,
wherein the one or more connector terminals are at opposite ends of each of the plurality of arms,
wherein each column of the plurality of columns comprises a subset of the plurality of IC chips, and
wherein the IC chips in each subset are placed directly adjacent to one another without intervening metallic spacers.

20. The method of claim 19, further comprising immersing the circuit board in a dielectric liquid, wherein the dielectric liquid is thermo-conductive.

* * * * *